United States Patent
Ishioka et al.

(10) Patent No.: US 8,508,394 B2
(45) Date of Patent: Aug. 13, 2013

(54) SEMICONDUCTOR INTEGRATED DEVICE AND OPERATION METHOD THEREOF

(75) Inventors: Toshiyuki Ishioka, Kanagawa (JP); Takuji Aso, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 41 days.

(21) Appl. No.: 13/345,152

(22) Filed: Jan. 6, 2012

(65) Prior Publication Data

US 2012/0176261 A1     Jul. 12, 2012

(30) Foreign Application Priority Data

Jan. 11, 2011   (JP) ................................ 2011-002829

(51) Int. Cl.
*H03M 1/00*   (2006.01)
(52) U.S. Cl.
USPC ............ 341/123; 341/120; 341/155; 341/141
(58) Field of Classification Search
USPC ........................... 341/123, 141.155, 117–120
See application file for complete search history.

(56) References Cited

U.S. PATENT DOCUMENTS 5,874,909 A  *  2/1999  Soenen et al. ................ 341/141
6,975,262 B2   12/2005  Yada et al.

FOREIGN PATENT DOCUMENTS

JP          01-206726 A    8/1989
JP          2005-026805 A  1/2005

\* cited by examiner

*Primary Examiner* — Jean B Jeanglaude
(74) *Attorney, Agent, or Firm* — Mattingly & Malur, PC

(57) ABSTRACT

In a semiconductor integrated circuit, having a central processing unit, a clock generating unit, an A/D converter and a sample and hold signal generating circuit, noise from an element that operates in accordance with operation timing that is difficult to predict beforehand is reduced. In a calibration operation, in response to a clock signal from the clock generating unit, a sample and hold signal generating circuit supplies a plurality of clock signals sequentially to a sample and hold circuit of the A/D converter. By analyzing a plurality of digital signals that are sequentially output from an A/D conversion circuit of the A/D converter, a timing of a holding period for allowing A/D conversion under a low noise condition is selected from the clock signals. In normal operation, a clock signal selected by the calibration operation is supplied as a sample and hold control signal to the sample and hold circuit.

20 Claims, 5 Drawing Sheets

# SEMICONDUCTOR INTEGRATED DEVICE AND OPERATION METHOD THEREOF

CROSS-REFERENCE TO RELATED APPLICATIONS

The disclosure of Japanese Patent Application No. 2011-2829 filed on Jan. 11, 2011 including the specification, drawings and abstract is incorporated herein by reference in its entirety.

BACKGROUND

The present invention relates to a semiconductor integrated circuit equipped with an analog-digital converter and an operation method thereof, and also relates to a technique that is effective for reducing noise from a noise source element or the like that operates in accordance with operation timing that is hard to predict beforehand.

In a semiconductor integrated circuit such as a microcomputer and a microcontroller incorporating an A/D converter, externally supplied analog signals are converted to digital signals by the A/D converter and the digital signals are supplied to a Central Processing Unit (CPU).

In Patent Document 1 listed below, there is described a microcomputer incorporating an A/D converter. To an input terminal of the A/D converter, an analog multiplexer is coupled to select one of a plurality of analog signals which are supplied from a plurality of external terminals. The incorporated A/D converter is configured as a successive approximation type A/D converter including a comparator circuit of a sample and hold circuit type, a digital unit, a successive approximation register, and a local DA converter.

The A/D converter installed in a semiconductor integrated circuit needs to convert externally input analog signals to digital signals accurately. However, these analog signals are affected by various noises from logics internal to the semiconductor chip of the semiconductor integrated circuit or logics on a mounting substrate on which the semiconductor integrated circuit is mounted, among others. Consequently, digital signals resulting from A/D conversion include some noise.

In Patent Document 2 listed below, there is described a digital/analog mixed integrated circuit in which, in order to prevent the signal-to-noise ratio of an analog circuit including a sample and hold circuit from being deteriorated by noise that is generated by an operation clock of a digital circuit, the operation clock of the digital circuit and the operation clock of the analog circuit including the sample and hold circuit are synchronized with each other by generating both clocks, for example, from a single reference clock. Further, by using a logic circuit, the operation clock of the sample and hold circuit is set to have a time lag for a fixed period from a changing point of the operation clock of the digital circuit. Therefore, it is avoided that timing of the operation clock of the sample and hold circuit coincides with timing of the operation clock of the digital circuit. Then, the sample and hold circuit can always hold analog signals during a period when no noise is generated. In this way, the purpose of preventing deterioration of the signal-to-noise ratio of the analog circuit can be achieved.

RELATED ART DOCUMENTS

Patent Documents

[Patent Document 1] Japanese Published Unexamined Patent Application No. 2005-26805

[Patent Document 2] Japanese Published Unexamined Patent Application No. Hei 1 (1989)-206726

SUMMARY

The present inventors engaged in development of an A/D converter that is incorporated in a microcomputer before conceiving this invention. Because this A/D converter was required to have a high precision, countermeasures against noise were necessary.

Therefore, the method for preventing the deterioration due to noise described in the above-mentioned Patent Document 2 was examined by the present inventors before conceiving this invention. In this method for preventing the deterioration due to noise, however, a shift amount (lag time interval) between the timing of the operation clock of the sample and hold circuit and the timing of the operation clock of the digital circuit is set to a fixed period that was predicted beforehand by the logic circuit. Hence, the following problem was revealed: as for noise from a noise source element or the like that operates in accordance with operation timing that is hard to predict beforehand, the deterioration due to such noise cannot be prevented. More specifically, since a variety of high functionality modules operating at a high speed are incorporated in recent semiconductor integrated circuits integrated to a large scale, it is hard to predict beforehand timing of the operation clock of such a high functionality module. Besides, as for other high functionality devices such as high-speed logics operating at a high speed installed on a mounting substrate outside the semiconductor integrated circuit, it is also hard to predict beforehand timing of their operation clock.

The present invention was devised based on the result of the examination as noted above by the present inventors before conceiving this invention.

Therefore, one object of the present invention is to reduce noise from a noise source element or the like that operates in accordance with operation timing that is hard to predict beforehand.

Another object of the present invention is to reduce noise from a high functionality module internal to the semiconductor integrated circuit or a high functionality device or the like installed on the mounting substrate, operating in accordance with operation timing that is hard to predict beforehand.

The above-noted and other objects and novel features of the present invention will become apparent from the following description in the present specification and the accompanying drawings.

A typical aspect of the invention disclosed in this application is summarized as follows.

A semiconductor integrated circuit (1) according to an exemplary embodiment of the present invention includes an A/D converter (121) that includes a sample and hold circuit (1211) and an A/D conversion circuit (1212) and a central processing unit (21) in a semiconductor chip.

Analog input signals (Vin) are supplied from the sample and hold circuit during a holding period to an input terminal of the A/D conversion circuit and digital output signals ($D_0$ to $D_{N-1}$) are generated from an output terminal of the A/D conversion circuit.

The central processing unit performs data processing of the digital output signals.

The semiconductor integrated circuit further includes a clock generating unit (30) and a sample and hold signal generating circuit (123) in the semiconductor chip.

The clock generating unit generates an operation clock signal ($\phi_{CLK}$) which is supplied to the central processing unit and a clock output signal ($\phi_O$) which is supplied to the sample and hold signal generating circuit.

In a calibration operation of the semiconductor integrated circuit, in response to the clock output signal, the sample and hold signal generating circuit generates a plurality of clock signals ($\phi_1$ to $\phi_8$) whose timings differ from one another and supplies the clock signals sequentially to a sample and hold control input terminal of the sample and hold circuit.

In the calibration operation, the A/D conversion circuit converts a plurality of analog signals held at each timing of each of the clock signals by the sample and hold circuit sequentially to a plurality of digital signals.

In the calibration operation, by executing analysis of the digital signals, a timing of a holding period of the sample and hold circuit for allowing A/D conversion of the A/D converter under a low noise condition is selected from the clock signals.

In a normal operation of the semiconductor integrated circuit, a clock signal having the timing of the holding period, selected out of the clock signals by the calibration operation, is supplied to the sample and hold circuit as a sample and hold control signal ($\phi_{SH}$) and analog signals held at the timing of the sample and hold control signal by the sample and hold circuit are A/D converted by the A/D conversion circuit and output as the digital output signals ($D_0$ to $D_{N-1}$) (see FIG. 1 and FIG. 2).

Effect that will be achieved by a typical aspect of the invention disclosed herein is briefly described below.

According to the present invention, it is possible to reduce noise from a noise source element or the like that operates in accordance with operation timing that is hard to predict beforehand.

DETAILED DESCRIPTION

1. General Outline of Embodiments

Figure 1:
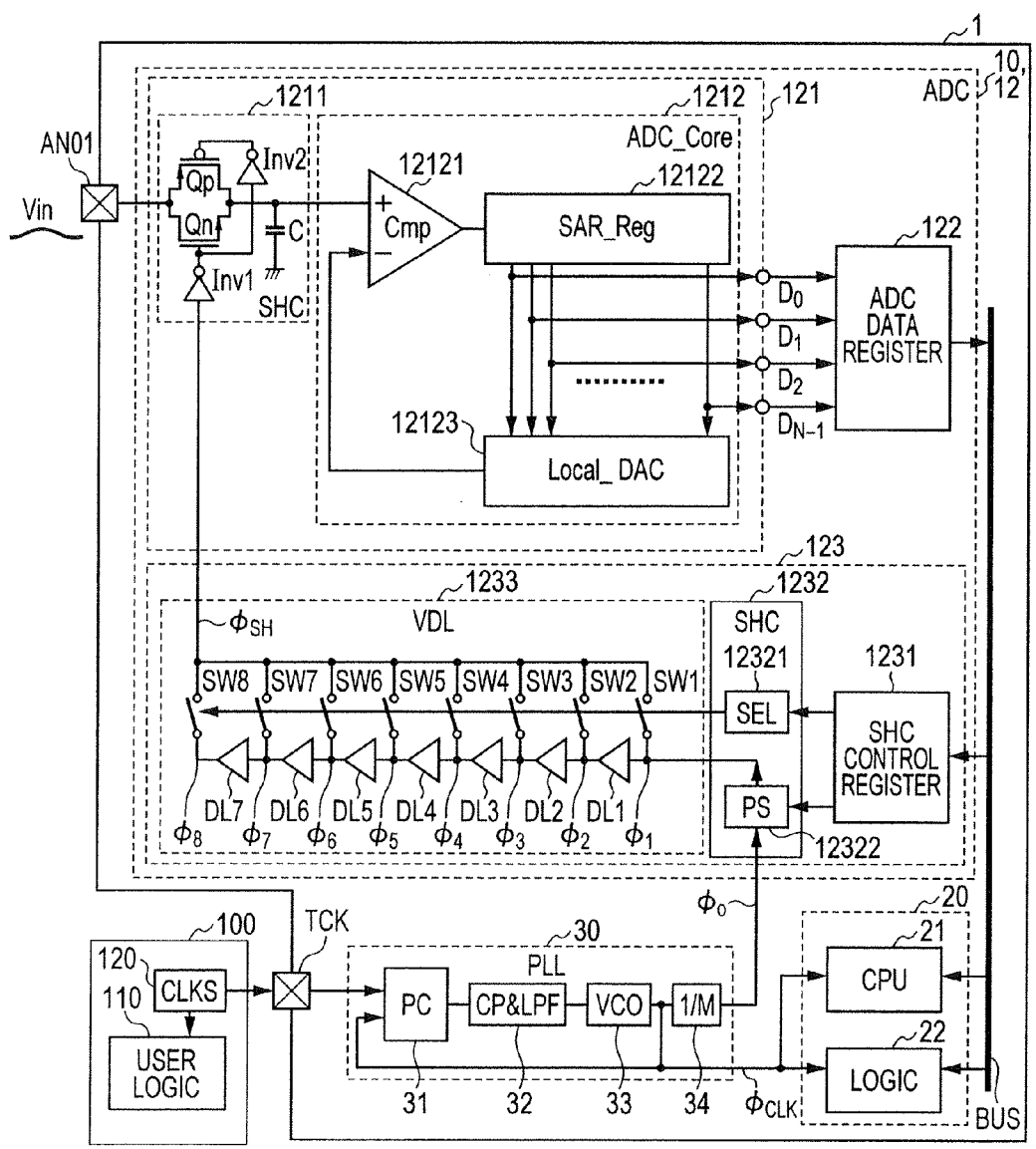
FIG. 1 is a diagram showing a configuration of a semiconductor integrated circuit 1 according to a first embodiment of the present invention.

To begin with, exemplary embodiments of the present invention disclosed herein are outlined. In the following general description of exemplary embodiments, reference designators (numerals) in the drawings, which are given for referential purposes in parentheses, are only illustrative of elements that fall in the concepts of the components identified by the designators.

[1] An exemplary embodiment of the present invention is a semiconductor integrated circuit (1) including an A/D converter (121) that includes a sample and hold circuit (1211) and an A/D conversion circuit (1212) and a central processing unit (21) in a semiconductor chip.

Analog input signals (Vin) can be supplied from the sample and hold circuit during a holding period to an input terminal of the A/D conversion circuit and digital output signals ($D_0$ to $D_{N-1}$) resulting from A/D conversion can be generated from an output terminal of the A/D conversion circuit.

The central processing unit can perform data processing of the digital output signals.

The semiconductor integrated circuit further includes a clock generating unit (30) and a sample and hold signal generating circuit (123) in the semiconductor chip.

The clock generating unit generates an operation clock signal ($\phi_{CLK}$) which is supplied to the central processing unit and a clock output signal ($\phi_O$) which is supplied to the sample and hold signal generating circuit.

In a calibration operation of the semiconductor integrated circuit, in response to the clock output signal, the sample and hold signal generating circuit generates a plurality of clock signals ($\phi_1$ to $\phi_8$) whose timings differ from one another and supplies the clock signals sequentially to a sample and hold control input terminal of the sample and hold circuit.

In the calibration operation, the A/D conversion circuit converts a plurality of analog signals held at each timing of each of the clock signals by the sample and hold circuit sequentially to a plurality of digital signals.

In the calibration operation, by executing analysis of the digital signals, a timing of a holding period of the sample and hold circuit for allowing A/D conversion of the A/D converter under a low noise condition is selected from the clock signals.

Figure 2:
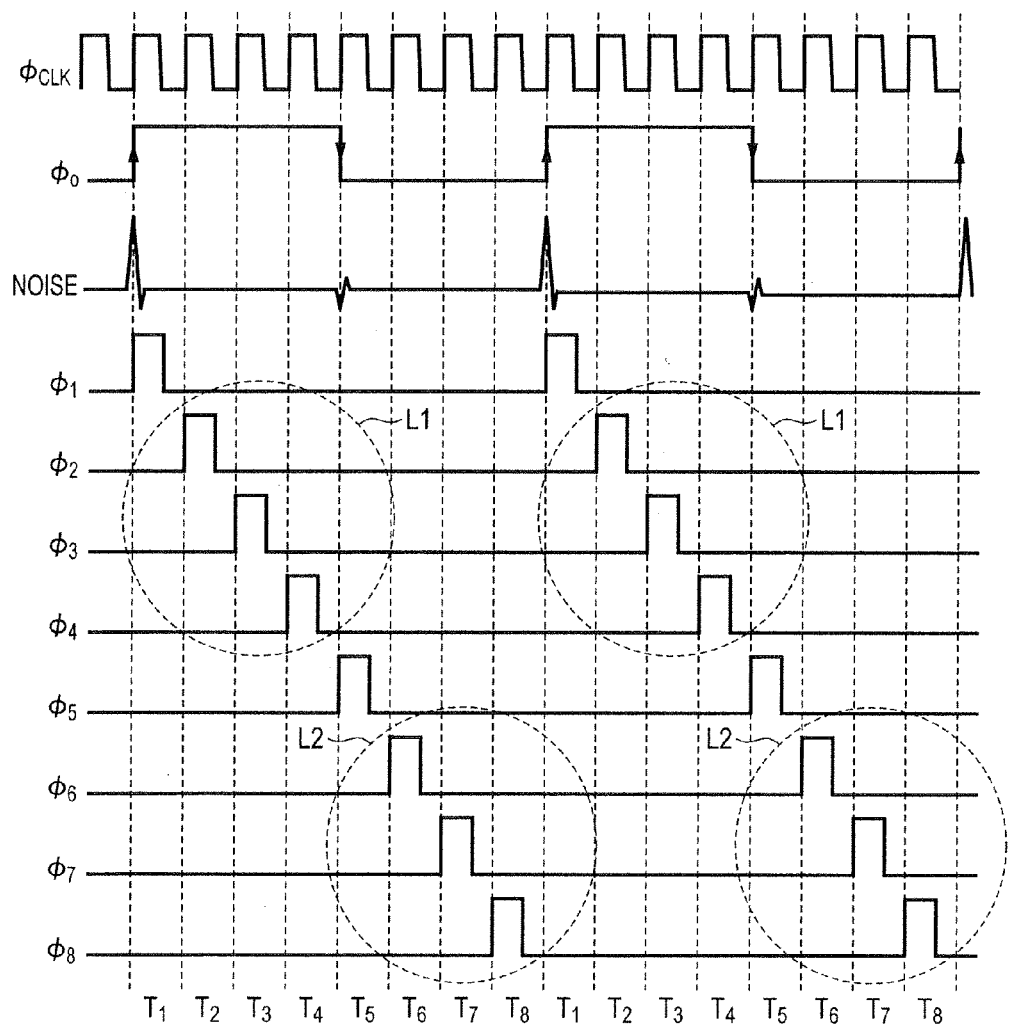
FIG. 2 is a waveform chart for explaining a calibration operation for allowing the A/D converter 12 to implement A/D conversion operation under a low noise condition, which is executed in the semiconductor integrated circuit 1 of the first embodiment of the present invention shown in FIG. 1.

In a normal operation of the semiconductor integrated circuit, a clock signal having the timing of the holding period, selected out of the clock signals by the calibration operation, is supplied to the sample and hold circuit as a sample and hold control signal ($\phi_{SH}$) and analog signals held at the timing of the sample and hold control signal by the sample and hold circuit are A/D converted by the A/D conversion circuit and output as the digital output signals ($D_0$ to $D_{N-1}$) (see FIG. 1 and FIG. 2).

According to the above embodiment, it is possible to reduce noise from a noise source element or the like that operates in accordance with operation timing that is hard to predict beforehand.

In a preferable embodiment, the sample and hold signal generating circuit includes a variable delay circuit (1233) a control unit (1232) that controls the variable delay circuit, and a control register (1231) for the control unit.

The variable delay circuit includes a plurality of delay circuits (DL1 to DL7) that generate a plurality of clock signals ($\phi_1$ to $\phi_8$) whose timings differ from one another in response to the clock output signal and a plurality of switches (SW1 to SW8), the clock signals being supplied to one ends of the switches and the other ends of the switches being coupled in common to the sample and hold control input terminal of the sample and hold circuit.

In the calibration operation, the clock signals are supplied, as the sample and hold control signal, sequentially to the sample and hold control input terminal of the sample and hold circuit by controlling the switches in the variable delay circuit to be in a conducting state in sequence under control of the control unit.

Selection data for selecting the timing of the holding period for allowing the A/D conversion under a low noise condition from the clock signals by executing the analysis of the digital signals in the calibration operation is stored in the control register of the sample and hold signal generating circuit.

In the normal operation, in response to the selection data stored in the control register of the sample and hold signal generating circuit, the control unit controls one switch selected among the switches in the variable delay circuit to be in a conducting state and, by the one switch, the clock signal is selected as the sample and hold control signal and supplied to the sample and hold circuit (see FIG. 1 and FIG. 2).

Figure 4:
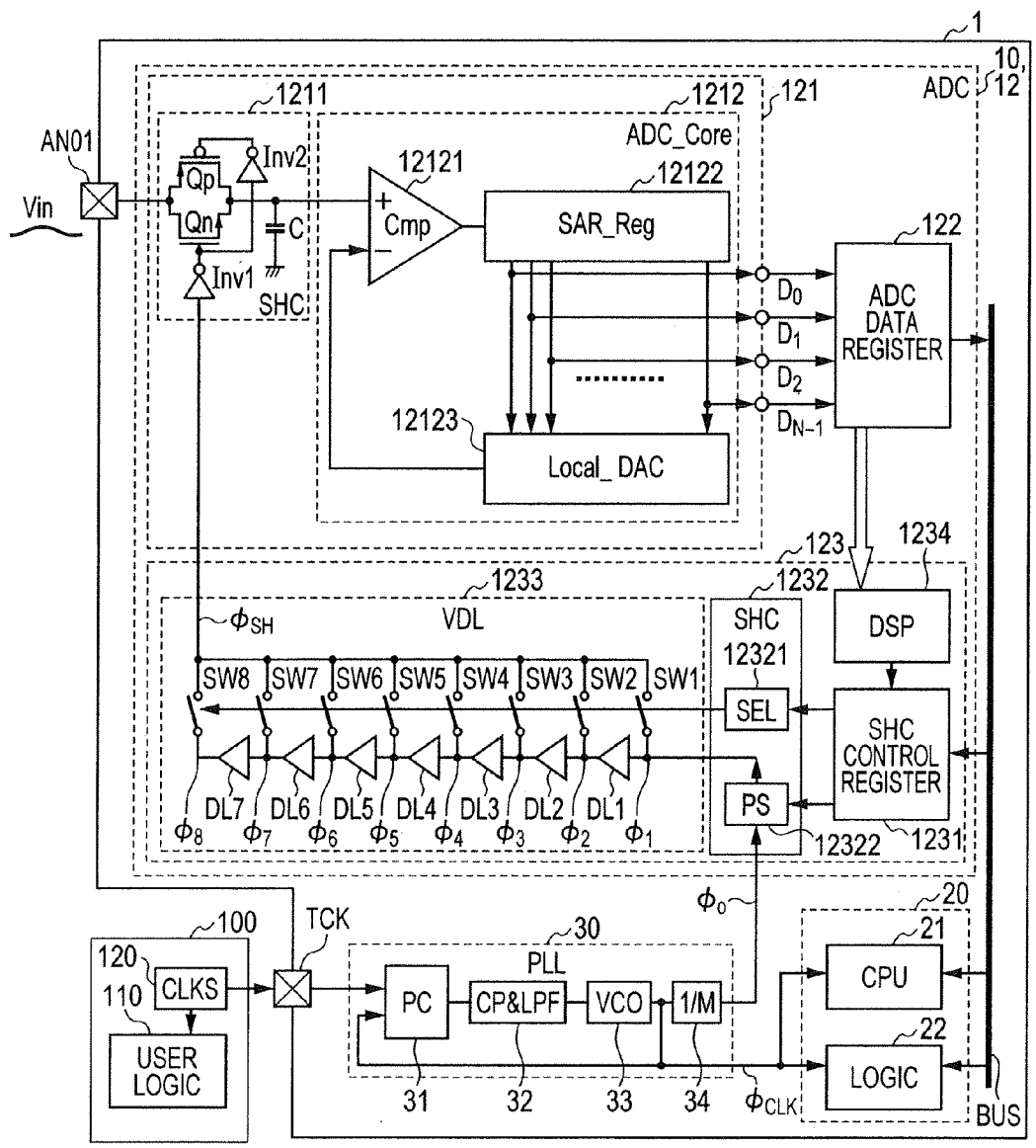
FIG. 4 is a diagram showing another configuration of a semiconductor integrated circuit 1 according to a second embodiment of the present invention.

In another preferable embodiment, the clock generating unit is configured by a phase locked loop circuit (30) including a voltage controlled oscillator (33) that generates the operation clock signal and a frequency divider (34) that generates the clock output signal by diving the frequency of the operation clock signal (see FIG. 1 and FIG. 4).

In a further preferable embodiment, the analysis of the digital signals in the calibration operation is executed by the central processing unit or a digital signal processor (1234) formed in the semiconductor chip (see FIG. 1 and FIG. 4).

The semiconductor integrated circuit according to a more preferable embodiment further includes a memory for storing a program for the analysis of the digital signals in the calibration operation to be executed by the central processing unit or the digital signal processor in the semiconductor chip.

In another more preferable embodiment, the memory for storing the program is a nonvolatile memory.

In a further more preferable embodiment, the calibration operation is executed in an initialization sequence upon power-on of the semiconductor integrated circuit.

In an alternative more preferable embodiment, during normal operation of the semiconductor integrated circuit, the calibration operation is executed, each time a predetermined operating time period has elapsed after the start of the normal operation.

In a concrete embodiment, the A/D converter (12) is configured by any of a successive approximation type A/D converter, a flash type A/D converter, a pipeline type A/D converter, and a ΣΔ type A/D converter.

The semiconductor integrated circuit according to a most concrete embodiment further includes an analog multiplexer (11) that can output a signal on one analog input terminal arbitrarily selected from a plurality of analog input terminals (AN0, AN1 . . . AN7) to its output terminal in the semiconductor chip.

Figure 5:
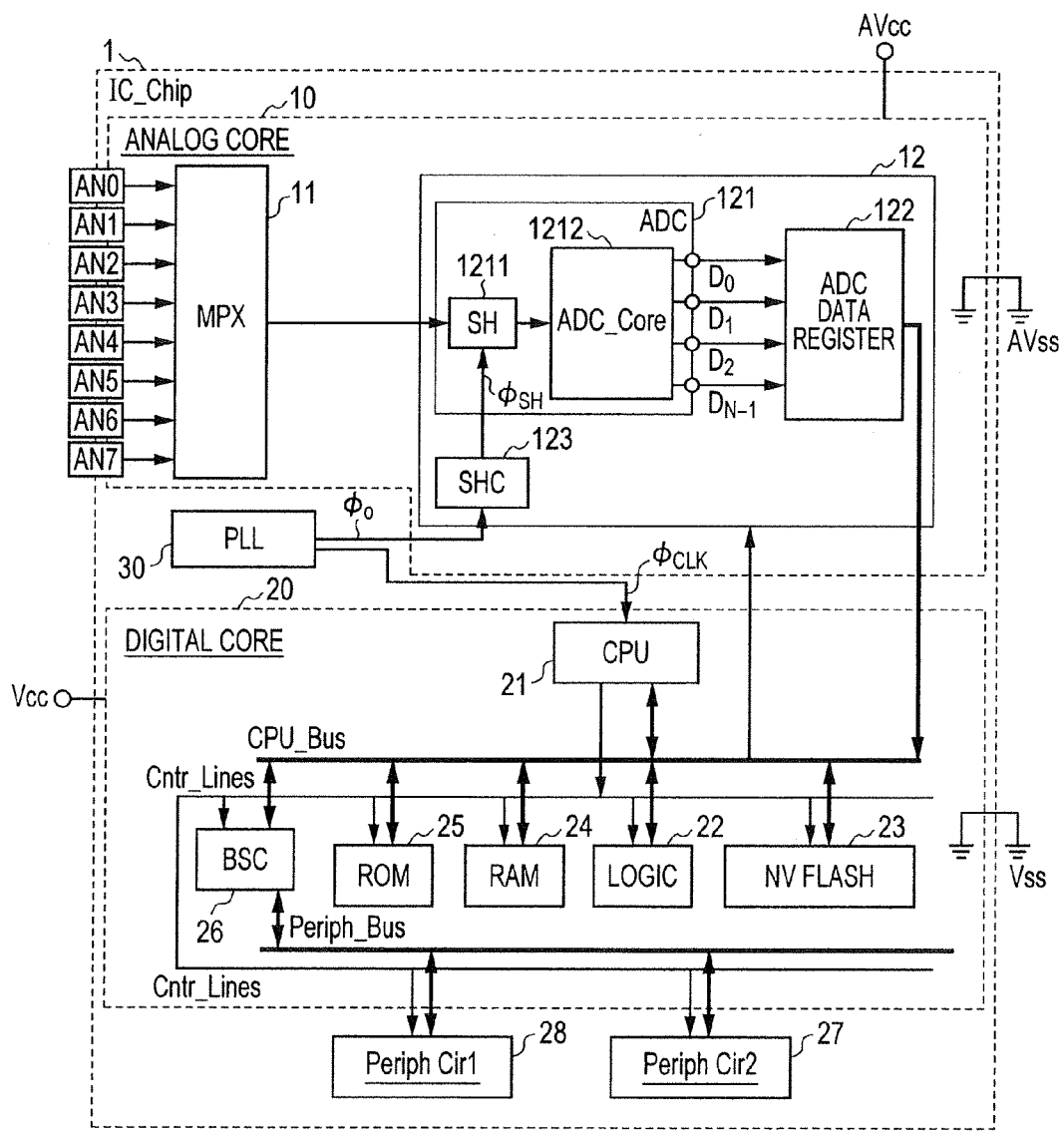
FIG. 5 is a diagram showing a concrete configuration of a semiconductor integrated circuit 1 configured as a microcontroller unit (MPU) according to a third embodiment of the present invention.

An analog selected output signal which has been output from the output terminal of the analog multiplexer can be supplied to an input terminal of the sample and hold circuit (see FIG. 5).

[2] An exemplary embodiment of the present invention in another aspect is an operation method of a semiconductor integrated circuit (1) including an A/D converter (121) that includes a sample and hold circuit (1211) and an A/D conversion circuit (1212) and a central processing unit (21) in a semiconductor chip.

Analog input signals (Vin) can be supplied from the sample and hold circuit during a holding period to an input terminal of the A/D conversion circuit and digital output signals ($D_0$ to $D_{N-1}$) resulting from A/D conversion can be generated from an output terminal of the A/D conversion circuit.

The central processing unit can perform data processing of the digital output signals.

The semiconductor integrated circuit further includes a clock generating unit (30) and a sample and hold signal generating circuit (123) in the semiconductor chip.

The clock generating unit generates an operation clock signal ($\phi_{CLK}$) which is supplied to the central processing unit and a clock output signal ($\phi_O$) which is supplied to the sample and hold signal generating circuit.

In a calibration operation of the semiconductor integrated circuit, in response to the clock output signal, the sample and hold signal generating circuit generates a plurality of clock signals ($\phi_1$ to $\phi_8$) whose timings differ from one another and supplies the clock signals sequentially to a sample and hold control input terminal of the sample and hold circuit.

In the calibration operation, the A/D conversion circuit converts a plurality of analog signals held at each timing of each of the clock signals by the sample and hold circuit sequentially to a plurality of digital signals.

In the calibration operation, by executing analysis of the digital signals, a timing of a holding period of the sample and hold circuit for allowing A/D conversion of the A/D converter under a low noise condition is selected from the clock signals.

In a normal operation of the semiconductor integrated circuit, a clock signal having the timing of the holding period, selected out of the clock signals by the calibration operation, is supplied to the sample and hold circuit as a sample and hold control signal ($\phi_{SH}$) and analog signals held at the timing of the sample and hold control signal by the sample and hold circuit are A/D converted by the A/D conversion circuit and output as the digital output signals ($D_0$ to $D_{N-1}$) (see FIG. 1 and FIG. 2).

According to the above embodiment, it is possible to reduce noise from a noise source element or the like that operates in accordance with operation timing that is hard to predict beforehand.

2. Details on Embodiments

Embodiments of the invention will then be described in greater detail. In all drawings for explaining preferred embodiments for implementing the invention, a component having the same function as the component in a previous drawing is assigned the same reference designator and its repeated description is omitted.

First Embodiment

《 Configuration of a Semiconductor Integrated Circuit 》 FIG. 1 is a diagram showing a configuration of a semiconductor integrated circuit 1 according to a first embodiment of the present invention.

The semiconductor integrated circuit 1 according to this embodiment of the present invention, shown in FIG. 1, includes an analog circuit 10, a digital circuit 20, and a phase locked loop (PLL) circuit 30. Further, the semiconductor integrated circuit 1 can be electrically coupled to another high functionality device 100 installed on a mounting substrate. This high functionality device 100 includes a user logic 110 and a clock generating circuit 120.

The analog circuit 10 includes an A/D converter 12; the digital circuit 20 includes a central processing unit (CPU) 21 and a logic circuit 22; and the phase locked loop circuit 30 includes a phase comparator (PC) 31, a charge pump and low pass filter (CP & LPF) 32, a voltage controlled oscillator (VCO) 33, and a frequency divider (1/M) 34.

《 A/D Converter in the Analog Circuit 》 As shown in FIG. 1, the A/D converter 12 in the analog circuit 10 includes an A/D conversion circuit 121, an A/D converted data register 122, and a sample and hold control signal generating circuit 123. The A/D conversion circuit 121 includes a sample and hold circuit (SHC) 1211 and an A/D conversion core circuit 1212.

《Sample and Hold Circuit》 The sample and hold circuit 1211 includes a P-channel MOS transistor Qp, an N-channel MOS transistor Qn, a first CMOS inverter Inv1, a second CMOS inverter Inv2, and a sampling capacitor C. A source to drain current path of the P-channel MOS transistor Qp and a drain to source current path of the N-channel MOS transistor Qn are coupled in parallel between an analog input terminal AN01 and one end of the sampling capacitor C. The other end of the sampling capacitor C is coupled to a ground potential.

An output terminal of the first CMOS inverter Inv1 is coupled to a gate terminal of the N-channel MOS transistor Qn in the sample and hold circuit 1211. An input terminal and an output terminal of the second CMOS inverter Inv2 are coupled to the gate terminal of the N-channel MOS transistor Qn and a gate terminal of the P-channel MOS transistor Qp, respectively. Further, a sample and hold control signal $\phi_{SH}$ from a variable delay circuit (VDL) 1233 in the sample and hold control signal generating circuit 123 is supplied to an input terminal of the first CMOS inverter Inv1.

During a sampling period when the sample and hold control signal $\phi_{SH}$ is at low level, both the transistors Qp and Qn of a CMOS analog switch are controlled to be in a conducting state. Thus, an analog input voltage Vin at the analog input terminal AN01 is supplied across both ends of the sampling capacitor C. During this sampling period, a change in a sampling voltage across both ends of the sampling capacitor C follows a change in the analog input voltage Vin.

During a holding period when the sample and hold control signal $\phi_{SH}$ is at high level, both the transistors Qp and Qn of the CMOS analog switch are controlled to be in a non-conducting state. Thus, a holding voltage across both ends of the sampling capacitor C is determined by the last sampling voltage in the sampling period immediately before the holding period. An analog input signal that is supplied to the A/D conversion core circuit 1212 is the holding voltage across both ends of the sampling capacitor C in the sample and hold circuit 1211 during a holding period.

《A/D Conversion Core Circuit》 As shown in FIG. 1, the A/D conversion core circuit 1212 is configured by a successive approximation type A/D converter including a comparator 12121, a successive approximation register 12122, and a local D/A converter 12123.

The comparator 12121 performs an analog voltage comparison between an analog input voltage Vin that is supplied to its non-inverting input terminal from the sample and hold circuit 1211 during a holding period and a feedback analog output voltage that is supplied to its inverting input terminal from the local D/A converter 12123. The successive approximation register 12122 holds an initial value of comparison, while updating the value held therein according to a pre-defined algorithm in response to a comparison result of a voltage comparison output signal of the comparator 12121.

Further, comparison output signals of the comparator 12121 are output as A/D converted digital output signals $D_0$ to $D_{N-1}$ from the successive approximation type A/D converter and stored into the A/D converted data register 122 and, at the same time, supplied to input terminals of the local D/A converter 12123, In consequence, the local D/A converter 12123 generates a feedback analog output voltage corresponding to a digital update value held in the successive approximation register 12122 and supplies it to the inverting input terminal of the comparator 12121.

《Sample and Hold Control Signal Generating Circuit》 The sample and hold control signal generating circuit 123 is comprised of a sample and hold control register 1231, a sample and hold control unit (SHC) 1232, and a variable delay circuit (VDL) 1233.

The sample and hold control register 1231 is provided so that control data generated from the central processing unit (CPU) 21 in the digital circuit 20 can be stored into it via a data bus (Bus).

The sample and hold control unit 1232 includes a selector 12321 and a phase shifter 12322. Delay selection data of control data generated from the central processing unit 21 is supplied to the selector 12321 and phase control data of control data generated from the central processing unit 21 is supplied to the phase shifter 12322.

The variable delay circuit 1233 includes seven CMOS delay circuits DL1, DL2, DL3, DL4, DL5, DL6, DL7 which are coupled in series and eight CMOS analog switches SW1, SW2, SW3, SW4, SW5, SW6, SW7, SW8.

A first clock signal $\phi_1$ that is generated from the phase shifter 12322 in the sample and hold control unit 1232 is supplied to an input terminal of a first CMOS delay circuit DL1 and one end of a first CMOS analog switch SW1. The other end of the first CMOS analog switch SW1 is coupled to an output terminal of the variable delay circuit 1233 in common with the other ends of second through eighth CMOS analog switches SW2 to SW8.

A second clock signal $\phi_2$ that is generated from an output terminal of the first CMOS delay circuit DL1 is supplied to an input terminal of a second CMOS delay circuit DL2 and one end of a second CMOS analog switch SW2.

A third clock signal $\phi_3$ that is generated from an output terminal of the second CMOS delay circuit DL2 is supplied to an input terminal of a third CMOS delay circuit DL3 and one end of a third CMOS analog switch SW3.

A fourth clock signal $\phi_4$ that is generated from an output terminal of the third CMOS delay circuit DL3 is supplied to an input terminal of a fourth CMOS delay circuit DL4 and one end of a fourth CMOS analog switch SW4.

A fifth clock signal $\phi_5$ that is generated from an output terminal of the fourth CMOS delay circuit DL4 is supplied to an input terminal of a fifth CMOS delay circuit DL5 and one end of a fifth CMOS analog switch SW5.

A sixth clock signal $\phi_6$ that is generated from an output terminal of the fifth CMOS delay circuit DL5 is supplied to an input terminal of a sixth CMOS delay circuit DL6 and one end of a sixth CMOS analog switch SW6.

A seventh clock signal $\phi_7$ that is generated from an output terminal of the sixth CMOS delay circuit DL6 is supplied to an input terminal of a seventh CMOS delay circuit DL7 and one end of a seventh CMOS analog switch SW7.

An eighth clock signal $\phi_8$ that is generated from an output terminal of the seventh CMOS delay circuit DL7 is supplied to one end of an eighth CMOS analog switch SW8.

The second clock signal $\phi_2$ is delayed from the first clock signal by a delay time of the first CMOS delay circuit DL1. The third clock signal $\phi_3$ is delayed from the second clock signal $\phi_2$ by a delay time of the second CMOS delay circuit DL2. The fourth clock signal $\phi_4$ is delayed from the third clock signal $\phi_3$ by a delay time of the third CMOS delay circuit DL3. The fifth clock signal $\phi_5$ is delayed from the fourth clock signal $\phi_4$ by a delay time of the fourth CMOS delay circuit DL4. The sixth clock signal $\phi_6$ is delayed from the fifth clock signal $\phi_5$ by a delay time of the fifth CMOS delay circuit DL5. The seventh clock signal $\phi_7$ is delayed from the sixth clock signal $\phi_6$ by a delay time of the sixth CMOS delay circuit DL6. The eighth clock signal $\phi_8$ is delayed from the seventh clock signal $\phi_7$ by a delay time of the seventh CMOS delay circuit DL7. Each delay time of the first through seventh CMOS delay circuits DL1 to DL7 is set to be a substantially equal delay time interval.

In response to delay selection data as control data that is supplied from the central processing unit 21, the selector 12321 in the sample and hold control unit 1232 in the sample and hold control signal generating circuit 123 puts any one of the eight CMOS analog switches SW1, SW2, SW3, SW4, SW5, SW6, SW7, SW8 in the variable delay circuit 1233 in an ON state and the remaining seven CMOS analog switches in an OFF state. Accordingly, any one clock signal among the first through eighth clock signals $\phi_1$ to $\phi_8$ is supplied as a sample and hold control signal $\phi_{SH}$ from the variable delay circuit 1233 in the sample and hold control signal generating circuit 123 to the input terminal of the first CMOS inverter Inv1 in the sample and hold circuit 1211 for the A/D conversion core circuit 1212 in the A/D converter 12.

In response to phase control data as control data that is supplied from the central processing unit 21, the phase shifter 12322 in the sample and hold control unit 1232 in the sample and hold control signal generating circuit 123 generates the first clock signal $\phi_1$ having a predetermined phase relation to the phase of a frequency divided output signal $\phi_O$ that is generated from the frequency divider 34 in the phase locked loop circuit 30. More specifically, for example, if the phase control data represents a low level "0", the phase of the first clock signal $\phi_1$ becomes substantially the same as the phase of the frequency divided output signal $\phi_O$. If the phase control data represents a high level "1", the phase of the first clock signal $\phi_1$ is shifted to advance by a shift amount of 180 degrees (=$\pi$) relative to the phase of the frequency divided output signal $\phi_O$. This can easily be implemented by non-inversion and inversion of the frequency divided output signal $\phi_O$. Besides, a high level period of the first clock signal $\phi_1$ that is generated from the phase shifter 12322 determines a high level period of the second through eighth clock signals $\phi_2$ to $\phi_8$ as well as the sample and hold control signal $\phi_{SH}$; consequently, it determines a holding period of the sample and hold circuit 1211 in the A/D conversion circuit 121. Therefore, the phase shifter 12322 includes a one-shot pulse generating circuit for generating the first clock signal $\phi_1$ having a predetermined high level period therein.

《 Digital Circuit 》《 Central Processing Unit 》 The central processing unit 21 in the digital circuit 20 performs data processing of digital output signals $D_0$ to $D_{N-1}$ from the A/D conversion circuit 121 stored in the A/D converted data register 122 by executing a program stored in a random access memory (RAM) or a nonvolatile memory such as a flash memory, which is not shown in FIG. 1.

Moreover, according to the first embodiment, the central processing unit 21 determines a holding operation timing of the sample and hold circuit 1211 in the A/D converter 12 for realizing a minimum noise level by executing a noise analysis program stored in the random access memory (RAM) or the nonvolatile memory such as a flash memory. That is, the execution of the noise analysis program by the central processing unit 21 provides a calibration operation for allowing the A/D converter 12 to implement A/D conversion under a low noise condition.

《 Logic Circuit 》 The logic circuit 22 in the digital circuit 20 includes a random logic circuit that executes a variety of logical operations and further optionally includes a high functionality accelerator such as FPU (Floating Point arithmetic Unit), as necessary.

《 Phase Locked Loop Circuit 》 The phase locked loop circuit 30 includes the phase comparator 31, charge pump and low pass filter 32, voltage controlled oscillator 33, and frequency divider 34 to supply an operation clock signal $\phi_{CLK}$ to the central processing unit 21 and the logic circuit 22 in the digital circuit 20 and to supply a frequency divided output signal $\phi_O$ to the sample and hold control unit 1232 in the sample and hold control signal generating circuit 123.

As shown in FIG. 1, a reference clock signal from the clock generating circuit 120 in another high functionality device 100 installed on the mounting substrate is supplied via an external terminal TCK to one input terminal of the phase comparator 31 in the phase locked loop circuit 30 and an operation clock signal $\phi_{CLK}$ that is generated from an output terminal of the voltage controlled oscillator 33 is supplied to the other input terminal of the phase comparator 31. A phase difference signal between the reference clock signal and the operation clock signal $\phi_{CLK}$ is generated from an output terminal of the phase comparator 31 and supplied via the charge pump and low pass filter 32 to a control input terminal of the voltage controlled oscillator 33. As a result, the phase and frequency of the operation clock signal $\phi_{CLK}$ that is supplied to the central processing unit 21 and the logic circuit 22 in the digital circuit 20 coincide with the phase and frequency of the reference clock signal that is supplied to the external terminal TCK from the clock generating circuit 120 in another high functionality device 100.

《 Operation of Semiconductor Integrated Circuit 》

《 Calibration Operation for A/D Conversion Operation under Low Noise Condition 》 According to the semiconductor integrated circuit 1 of the first embodiment of the present invention shown in FIG. 1, by the execution of the noise analysis program by the central processing unit 21, the sample and hold circuit 1211 in the A/D converter 12 tries holding analog input signals at all operation timings of eight clock signals, the first through eighth clock signals $\phi_1$ to $\phi_8$. All eight analog voltage inputs Vin held by the holding at the timings of these eight clock signals are A/D converted to digital signals by the A/D conversion core circuit 1212.

Eight digital output signals $D_0$ to $D_{N-1}$ resulting from the A/D conversion of all eight analog voltage inputs Vin are stored in the A/D converted data register 122. Then, the central processing unit 21 compares the eight digital output signals $D_0$ to $D_{N-1}$ stored in the A/D converted data register 122 and extracts strongly correlated data as A/D converted digital output signals $D_0$ to $D_{N-1}$ that are less affected by noise from a noise source. That is, the central processing unit 21 extracts a majority of data having a substantially equivalent value among the eight digital output signals stored in the A/D converted data register 122 as A/D converted digital output signals that are less affected by noise from a noise source. On the other hand, the central processing unit 21 ignores a minority of data having values that differ from one another among the eight digital output signals stored in the A/D converted data register 122 as the data largely affected by noise from a noise source.

When the eight digital output signals stored in the A/D converted data register 122 are evaluated as to whether they are affected by noise, analog voltage inputs Vin can be supplied from various analog sensors in normal operation, which are supplied to the analog input terminal AN01 of the semiconductor integrated circuit 1 according to the first embodiment of the present invention shown in FIG. 1. The reason is that amplitude change of the analog voltage inputs Vin can be ignored during a sampling period of the eight clock signals, the first through eighth clock signals $\phi_1$ to $\phi_8$, because the frequency of normal analog voltage inputs Vin is extremely low than the frequency of the eight clock signals, the first through eighth clock signals $\phi_1$ to $\phi_8$. However, when the eight digital output signals are evaluated as to whether they are affected by noise, analog voltage inputs Vin maintained at a constant voltage can also be supplied to the analog input terminal AN01.

In this way, from the eight clock signals, i.e., the first through eighth clock signals $\phi_1$ to $\phi_8$, the central processing unit 21 selects clock signals having a holding operation timing, which give strongly correlated data extracted as A/D converted digital output signals $D_0$ to $D_{N-1}$ that are less affected by noise. Therefore, the central processing unit 21 can determine a holding operation timing of the sample and hold circuit 1211 in the A/D converter 12 for realizing a minimum noise level. In this way, by the execution of the noise analysis program by the central processing unit 21, it is possible to execute the calibration operation for allowing the A/D converter 12 to implement A/D conversion operation under a low noise condition.

Selection control data for selecting clock signals having a holding operation timing for realizing a minimum noise level determined by the calibration operation from the eight clock signals, the first through eighth clock signals $\phi_1$ to $\phi_8$ is stored in the sample and hold control register 1231 in the sample and hold control signal generating circuit 123.

According to the semiconductor integrated circuit 1 of the first embodiment of the present invention shown in FIG. 1, the central processing unit 21 is controlled by a program stored in the random access memory (RAM) or the nonvolatile memory such as a flash memory to execute the calibration operation for allowing the A/D converter 12 to implement A/D conversion operation under a low noise condition in an initialization sequence upon power-on of the semiconductor integrated circuit 1.

《 A/D Converter in Normal Operation 》 Furthermore, subsequently, in the semiconductor integrated circuit 1 of the first embodiment of the present invention shown in FIG. 1, the sample and hold control unit 1232 controls the variable delay circuit (VDL) 1233 in response to delay selection data and phase control data stored in the sample and hold control register 1231 in the sample and hold control signal generating circuit 123, so that the sample and hold circuit 1211 in the A/D converter 12 performs holding analog input signals at a holding operation timing of a clock signal for realizing a minimum noise level determined by the above-described calibration operation.

More specifically, A/D conversion of the A/D converter 12 in normal operation is performed such that a holding operation of the sample and hold circuit 1211 in the A/D converter 12 is executed by using a clock signal having a holding operation timing selected from the eight clock signals, the first through eighth clock signals $\phi_1$ to $\phi_8$ as the sample and hold control signal $\phi_{SH}$.

Moreover, in the semiconductor integrated circuit 1 in normal operation of the first embodiment of the present invention shown in FIG. 1, the central processing unit 21 is controlled by a program stored in the random access memory (RAM) or the nonvolatile memory such as a flash memory to execute the calibration operation for allowing the A/D converter 12 to implement A/D conversion operation under a low noise condition, each time a predetermined operating time period has elapsed after the start of normal operation of the A/D converter 12.

《 Waveform Chart Regarding Calibration Operation 》 FIG. 2 is a waveform chart for explaining a calibration operation for allowing the A/D converter 12 to implement A/D conversion operation under a low noise condition, which is executed in the semiconductor integrated circuit 1 of the first embodiment of the present invention shown in FIG. 1.

In FIG. 2, the operation clock signal $\phi_{CLK}$ that is generated from the voltage controlled oscillator 33 in the PLL circuit 30 of the semiconductor integrated circuit 1 in calibration operation is shown; the frequency divided output signal $\phi_O$ that is generated from the frequency divider 34 in the PLL circuit 30 is shown; further, the waveform of a noise (Noise) that interferes A/D conversion operation of the A/D converter 12 under a low noise condition is shown.

Besides, in FIG. 2, the following clock signals are shown: the first clock signal $\phi_1$ that is generated from the phase shifter 12322 in the sample and hold control unit 1232 of the semiconductor integrated circuit 1 in calibration operation; the second clock signal $\phi_2$ that is generated from the first CMOS delay circuit DL1; the third clock signal $\phi_3$ that is generated from the output terminal of the second CMOS delay circuit DL2; the fourth clock signal $\phi_4$ that is generated from the output terminal of the third CMOS delay circuit DL3; the fifth clock signal $\phi_5$ that is generated from the output terminal of the fourth CMOS delay circuit DL4; the sixth clock signal $\phi_6$ that is generated from the output terminal of the fifth CMOS delay circuit DL5; the seventh clock signal $\phi_7$ that is generated from the output terminal of the sixth CMOS delay circuit DL6; and the eighth clock signal $\phi_8$ that is generated from the output terminal of the seventh CMOS delay circuit DL7.

In the example of the waveform chart shown in FIG. 2, a noise with an extremely large amplitude (Noise) is generated at timing of rising from low level to high level of the frequency divided output signal $\phi_O$. Also, a noise with a non-negligible amplitude (Noise) is generated at timing of falling from high level to low level of the frequency divided output signal $\phi_O$.

Accordingly, in the calibration operation for allowing the A/D converter 12 to implement A/D conversion under a low noise condition, A/D converted digital output signals from analog voltage inputs held by the sample and hold circuit 1211 in the A/D converter 12 during a holding period corresponding to the high level operation timing of each of the second clock signal $\phi_2$, third clock signal $\phi_3$, fourth clock signal $\phi_4$, sixth clock signal $\phi_6$, seventh clock signal $\phi_7$, and eighth clock signal $\phi_8$ are extracted as a majority of A/D converted digital output signals that have a substantially equivalent value and are less affected by noise from a noise source. On the other hand, in this calibration operation, A/D converted digital output signals from analog voltage inputs held by the sample and hold circuit 1211 in the A/D converter 12 during a holding period corresponding to the high level operation timing of each of the first clock signal $\phi_1$ and the fifth clock signal $\phi_5$ are ignored as a minority of A/D converted digital output signals that have values differing from one another and are largely affected by noise from a noise source.

Consequently, in the semiconductor integrated circuit 1 in normal operation after the calibration operation, A/D conversion of the A/D converter 12 in normal operation is performed such that a holding operation of the sample and hold circuit 1211 in the A/D converter 12 is executed by using a clock signal having one holding operation timing selected from the second clock signal $\phi_2$, third clock signal $\phi_3$, fourth clock signal $\phi_4$, sixth clock signal $\phi_6$, seventh clock signal $\phi_7$, and eighth clock signal $\phi_8$ by the above-described calibration operation as the sample and hold control signal $\phi_{SH}$. As a result, A/D conversion operation of the A/D converter 12 under a low noise condition can be implemented.

Figure 3:
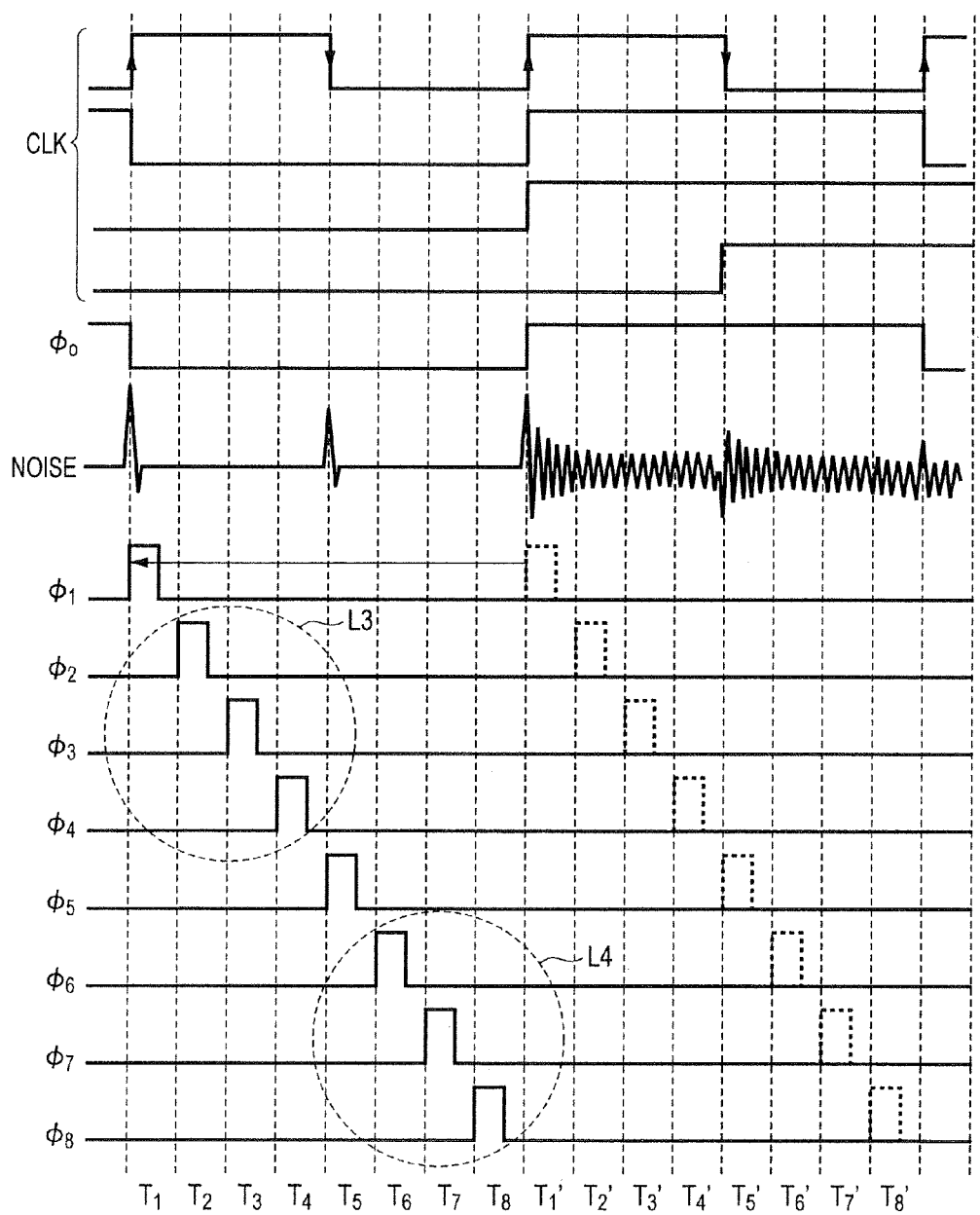
FIG. 3 is a waveform chart for explaining another calibration operation for allowing the A/D converter 12 to implement A/D conversion operation under a low noise condition, which is executed in the semiconductor integrated circuit 1 of the first embodiment of the present invention shown in FIG. 1.

《 Another Waveform Chart Regarding Calibration Operation 》 FIG. 3 is a waveform chart for explaining another calibration operation for allowing the A/D converter 12 to implement A/D conversion operation under a low noise condition, which is executed in the semiconductor integrated circuit 1 of the first embodiment of the present invention shown in FIG. 1.

In FIG. 3, multiple clock signals CLK that determine operation timings of various functionality modules integrated in the semiconductor integrated circuit 1 and another high functionality device 100 installed on the mounting substrate are shown; the frequency divided output signal $\phi_O$ that is generated from the frequency divider 34 in the PLL circuit 30 is shown; further, the waveform of a noise (Noise) that interferes A/D conversion operation of the A/D converter 12 under a low noise condition is shown.

In a calibration operation which is initially executed by the semiconductor integrated circuit 1, noise impact is analyzed at each timing from time $T_1'$ to time $T_8'$, i.e., at and after time $T_1'$ at which the frequency divided output signal $\phi_O$ from the frequency divider 34 changes from low level to high level. However, during the operation period from time $T_1'$ to time $T_8'$, because frequent level changes of the multiple clocks CLK and the frequency divided output signal $\phi_O$ occur, a noise with a large amplitude (Noise) is generated in this operation period. Accordingly, all eight digital output signals $D_0$ to $D_{N-1}$, A/D converted from analog voltage inputs held during this operation period, have values that differ from one another. By the result of this analysis by the central processing unit 21, it is decided by the central processing unit 21 that the A/D converter 12 in normal operation of the semiconductor integrated circuit 1 cannot achieve A/D conversion operation under a low noise condition during the operation period from time $T_1'$ to time $T_8'$.

According to the result of this decision, the phase of the frequency divided output signal $\phi_O$ that is generated from the frequency divider 34 in the PLL circuit 30 is controlled to advance by 180 degrees ($=\pi$). This can easily be implemented by non-inversion and inversion of the frequency divided output signal $\phi_O$. More specifically, in response to the result of the above decision, the CMOS inverter within the phase shifter 12322 in the sample and hold control unit 1232 supplies the first clock signal $\phi_1$ generated by inverting the frequency divided output signal $\phi_O$ supplied from the frequency divider 34 in the PLL circuit 30 to the input terminal of the first CMOS delay circuit DL1 and one end of the first CMOS analog switch SW1.

As a result, as shown in FIG. 3, the first clock signal $\phi_1$ is generated at time $T_1$ from the phase shifter 12322 in the sample and hold control unit 1232 of the semiconductor integrated circuit 1, the second clock signal $\phi_2$ is generated at time $T_2$ from the first CMOS delay circuit DL1, the third clock signal $\phi_3$ is generated at time $T_3$ from the output terminal of the second CMOS delay circuit DL2, the fourth clock signal $\phi_4$ is generated at time $T_4$ from the output terminal of the third CMOS delay circuit DL3, the fifth clock signal $\phi_5$ is generated at time $T_5$ from the output terminal of the fourth CMOS delay circuit DL4, the sixth clock signal $\phi_6$ is generated at time $T_6$ from the output terminal of the fifth CMOS delay circuit DL5, the seventh clock signal $\phi_7$ is generated at time $T_7$ from the output terminal of the sixth CMOS delay circuit DL6, and the eighth clock signal $\phi_8$ is generated at time $T_8$ from the output terminal of the seventh CMOS delay circuit DL7.

Accordingly, in a calibration operation which is next executed by the semiconductor integrated circuit 1, A/D converted digital output signals from analog voltage inputs held by the sample and hold circuit 1211 in the A/D converter 12 during a holding period corresponding to the high level operation timing of each of the second clock signal $\phi_2$, third clock signal $\phi_3$, fourth clock signal $\phi_4$, sixth clock signal $\phi_6$, seventh clock signal $\phi_7$, and eighth clock signal $\phi_O$ are extracted as a majority of A/D converted digital output signals that have a substantially equivalent value and are less affected by noise from a noise source. On the other hand, in this calibration operation, A/D converted digital output signals from analog voltage inputs held by the sample and hold circuit 1211 in the A/D converter 12 during a holding period corresponding to the high level operation timing of each of the first clock signal $\phi_1$ and the fifth clock signal $\phi_5$ are ignored as a minority of A/D converted digital output signals that have values differing from one another and are largely affected by noise from a noise source.

Consequently, in the semiconductor integrated circuit 1 in normal operation after the calibration operation, A/D conversion of the A/D converter 12 in normal operation is performed such that a holding operation of the sample and hold circuit 1211 in the A/D converter is executed by using a clock signal having one holding operation timing selected from the second clock signal $\phi_2$, third clock signal $\phi_3$, fourth clock signal $\phi_4$, sixth clock signal $\phi_6$, seventh clock signal $\phi_7$, and eighth clock signal $\phi_8$ by the above-described calibration operation as the sample and hold control signal $\phi_{SH}$. As a result, A/D conversion operation of the A/D converter 12 under a low noise condition can be implemented.

Second Embodiment

《 Another Configuration of a Semiconductor Integrated Circuit 》 FIG. 4 is a diagram showing another configuration of a semiconductor integrated circuit 1 according to a second embodiment of the present invention.

The semiconductor integrated circuit 1 according to the second embodiment of the present invention shown in FIG. 4 differs from the semiconductor integrated circuit 1 according to the first embodiment of the present invention shown in FIG. 1 in the following point.

That is, a digital signal processor (DSP) 1234 is added to the sample and hold control signal generating circuit 123 of the semiconductor integrated circuit 1 according to the second embodiment of the present invention shown in FIG. 4.

This digital signal processor 1234 on behalf of the central processing unit 21 compares eight digital output signals $D_0$ to $D_{N-1}$ stored in the A/D converted data register 122 and extracts strongly correlated data as A/D converted digital output signals $D_0$ to $D_{N-1}$ that are less affected by noise from a noise source. That is, the digital signal processor 1234 extracts a majority of data having a substantially equivalent value among the eight digital output signals stored in the A/D converted data register 122 as A/D converted digital output signals that are less affected by noise from a noise source. On the other hand, the digital signal processor 1234 ignores a minority of data having values that differ from one another among the eight digital output signals stored in the A/D converted data register 122 as the data largely affected by noise from a noise source.

Subsequently, from the eight clock signals, i.e., the first through eighth clock signals $\phi_1$ to $\phi_8$, the digital signal processor 1234 selects clock signals having a holding operation timing, which give strongly correlated data extracted as A/D converted digital output signals $D_0$ to $D_{N-1}$ that are less affected by noise. Therefore, the digital signal processor 1234 can determine a holding operation timing of the sample and hold circuit 1211 in the A/D converter 12 for realizing a minimum noise level. In this way, by the execution of the noise analysis program by the digital signal processor 1234, it is possible to execute the calibration operation for allowing the A/D converter 12 to implement A/D conversion operation under a low noise condition.

According to the semiconductor integrated circuit 1 of the second embodiment of the present invention shown in FIG. 4, the digital signal processor 1234 is controlled by a program stored in the random access memory (RAM) or the nonvolatile memory such as a flash memory to execute the calibration operation for allowing the A/D converter 12 to implement A/D conversion operation under a low noise condition in an initialization sequence upon power-on of the semiconductor integrated circuit 1.

Moreover, in the semiconductor integrated circuit 1 of the second embodiment of the present invention shown in FIG. 4, the digital signal processor 1234 is controlled by a program stored in the random access memory (RAM) or the nonvolatile memory such as a flash memory to execute the calibration operation for allowing the A/D converter 12 to implement A/D conversion operation under a low noise condition, each time a predetermined operating time period has elapsed after the start of normal operation of the A/D converter 12.

Third Embodiment

《Concrete Configuration of a Semiconductor Integrated Circuit》 FIG. 5 is a diagram showing a concrete configuration of a semiconductor integrated circuit 1 configured as a micro-controller unit (MPU) according to a third embodiment of the present invention.

As shown in FIG. 5, an analog circuit core 10 of the semiconductor integrated circuit 1 includes an analog multiplexer (MPX) 11 and an A/D converter 12.

《Analog Circuit Core》 The analog circuit core includes analog input terminals of eight channels AN0, AN1 ... AN7 of the analog multiplexer (MPX) 11 and an analog input signal arbitrarily selected from the eight channels can be output to an output terminal.

The A/D converter 12 shown in FIG. 5 includes an A/D conversion circuit 121, an A/D converted data register 122, and a sample and hold control signal generating circuit 123, configured in just the same way as those in the semiconductor integrated circuit 1 according to the first embodiment of the present invention shown in FIG. 1 and the semiconductor integrated circuit 1 according to the second embodiment of the present invention shown in FIG. 4. The A/D conversion circuit 121 includes a sample and hold circuit 1211 and an A/D conversion core circuit 1212.

Further, the A/D converter 12 shown in FIG. 5 includes a phase locked loop circuit 30 configured to supply an operation clock signal $\phi_{CLK}$ to a central processing unit 21 and a logic circuit 22 in a digital circuit 20 and to supply a frequency divided output signal $\phi_O$ to the sample and hold control signal generating circuit 123 in just the same way as in the semiconductor integrated circuit 1 according to the first embodiment of the present invention shown in FIG. 1 and the semiconductor integrated circuit 1 according to the second embodiment of the present invention shown in FIG. 4.

An analog power supply voltage AVcc that is set at a relatively high voltage, e.g., 5 volts is supplied to the analog circuit core 10; while an analog ground potential AVss is supplied to the analog circuit core 10.

《Digital Circuit Core》 A digital circuit core 20 in the semiconductor chip of the semiconductor integrated circuit 1 shown in FIG. 5 includes the central processing unit (CPU) 21, the logic circuit 22, a random access memory (RAM) 24, a flash nonvolatile memory device (NV_Flash) 23, a random access memory (RAM) 24, a read only memory (ROM) 25, and a bus switch controller (BSC) 26. A digital power supply voltage Vcc that is set at a relatively low voltage, e.g., approximately 1 volt is supplied to the digital circuit core 20; while a digital ground potential Vss is supplied to the digital circuit core 20.

More specifically, the random access memory (RAM) 24, flash nonvolatile memory device (NV_Flash) 23, read only memory (ROM) 25, and bus switch controller (BSC) 26 are coupled to the central processing unit (CPU) 21 via a CPU bus CPU_Bus and control lines Cntr_Lines. Moreover, a plurality of peripheral circuits Periph_Cir1, Periph_Cir2 are coupled to the central processing unit (CPU) 21 via the CPU bus CPU_Bus, control lines Cntr_Lines, peripheral bus Periph-_Bus, and bus switch controller (BSC) 26. Accordingly, an input analog signal selected and sampled by the analog multiplexer (MPX) 11 in the analog circuit core 10 is converted to a digital signal by the A/D converter 12 and the digital signal can be processed by the central processing unit (CPU) 21 via the peripheral bus Periph_Bus, bus switch controller (BSC) 26, and CPU bus CPU_Bus. Besides, the noise analysis program that is executed by the central processing unit 21 or digital signal processor to allow the A/D converter 12 to implement A/D conversion under a minimum noise level can be stored in any one of the random access memory 24, flash nonvolatile memory device 23, and read only memory 25.

While the invention made by the present inventors has been described specifically based on its embodiments hereinbefore, it will be obvious that the present invention is not limited to the described embodiments and various modifications may be made without departing from the scope of the invention.

For example, the A/D converter 12 is not limited to the successive approximation type A/D conversion circuit only; it will be obvious that the A/D converter can be configured by any of a flash type A/D converter, pipeline type A/D converter, and $\Sigma\Delta$ type A/D converter.

Besides, the element that generates operation clock signals is not limited to the phase locked loop circuit 30; for example, it can be configured with a ring oscillator or a clock oscillation circuit using a frequency to voltage conversion circuit.

Furthermore, as for the execution of the noise analysis program stored in the random access memory or the nonvolatile memory such as a flash memory by the central processing unit 21 or digital signal processor, alternatively, noise analysis can be executed by analyzing, by means of Fast Fourier Transform or the like, noise components caused by clock pulses having a frequency signal component higher than the frequency component of analog voltage inputs Vin that are supplied during a normal operation period of the A/D converter 12 and during a high level period of each of eight clock signals, the first through eighth clock signals $\phi_1$ to $\phi_8$ from the variable delay circuit 1233 in the sample and hold control signal generating circuit 123.

What is claimed is:
1. A semiconductor integrated circuit comprising, in a semiconductor chip, an A/D converter that includes a sample and hold circuit and an A/D conversion circuit, and a central processing unit,
   wherein analog input signals can be supplied from the sample and hold circuit during a holding period to an input terminal of the A/D conversion circuit, wherein digital output signals resulting from A/D conversion can be generated from an output terminal of the A/D conversion circuit,
wherein the central processing unit can perform data processing of the digital output signals,
the semiconductor integrated circuit further comprising:
in the semiconductor chip, a clock generating unit and a sample and hold signal generating circuit,
wherein the clock generating unit generates an operation clock signal which is supplied to the central processing unit and a clock output signal which is supplied to the sample and hold signal generating circuit,
wherein, in a calibration operation of the semiconductor integrated circuit, in response to the clock output signal, the sample and hold signal generating circuit generates a plurality of clock signals whose timings differ from one another and supplies the clock signals sequentially to a sample and hold control input terminal of the sample and hold circuit,
wherein in the calibration operation, the A/D conversion circuit converts a plurality of analog signals held at each timing of each of the clock signals by the sample and hold circuit sequentially to a plurality of digital signals,
wherein in the calibration operation, by executing analysis of the digital signals, a timing of a holding period of the sample and hold circuit for allowing A/D conversion of the A/D converter under a low noise condition is selected from the clock signals, and
wherein, in a normal operation of the semiconductor integrated circuit, a clock signal having the timing of the holding period, selected out of the clock signals by the calibration operation, is supplied to the sample and hold circuit as a sample and hold control signal and analog signals held at the timing of the sample and hold control signal by the sample and hold circuit are A/D converted by the A/D conversion circuit and output as the digital output signals.

2. The semiconductor integrated circuit according to claim 1,
wherein the sample and hold signal generating circuit comprises a variable delay circuit, a control unit that controls the variable delay circuit, and a control register for the control unit,
wherein the variable delay circuit comprises a plurality of delay circuits that generate a plurality of clock signals whose timings differ from one another in response to the clock output signal and a plurality of switches, the clock signals being supplied to one ends of the switches and the other ends of the switches being coupled in common to the sample and hold control input terminal of the sample and hold circuit,
wherein, in the calibration operation, the clock signals are supplied, as the sample and hold control signal, sequentially to the sample and hold control input terminal of the sample and hold circuit by controlling the switches in the variable delay circuit to be in a conducting state in sequence under control of the control unit,
wherein selection data for selecting the timing of the holding period for allowing the A/D conversion under a low noise condition from the clock signals by executing the analysis of the digital signals in the calibration operation is stored in the control register of the sample and hold signal generating circuit, and
wherein, in the normal operation, in response to the selection data stored in the control register of the sample and hold signal generating circuit, the control unit controls one switch selected among the switches in the variable delay circuit to be in a conducting state and, by the one switch, the clock signal is selected as the sample and hold control signal and supplied to the sample and hold circuit.

3. The semiconductor integrated circuit according to claim 2, wherein the clock generating unit is configured by a phase locked loop circuit comprising a voltage controlled oscillator that generates the operation clock signal and a frequency divider that generates the clock output signal by dividing the frequency of the operation clock signal.

4. The semiconductor integrated circuit according to claim 2, wherein the analysis of the digital signals in the calibration operation is executed by the central processing unit or a digital signal processor formed in the semiconductor chip.

5. The semiconductor integrated circuit according to claim 4, wherein the semiconductor integrated circuit further comprises a memory for storing a program for the analysis of the digital signals in the calibration operation to be executed by the central processing unit or the digital signal processor in the semiconductor chip.

6. The semiconductor integrated circuit according to claim 5, wherein the memory for storing the program is a nonvolatile memory.

7. The semiconductor integrated circuit according to claim 2, wherein the calibration operation is executed in an initialization sequence upon power-on of the semiconductor integrated circuit.

8. The semiconductor integrated circuit according to claim 7, wherein, during normal operation of the semiconductor integrated circuit, the calibration operation is executed, each time a predetermined operating time period has elapsed after the start of the normal operation.

9. The semiconductor integrated circuit according to claim 2, wherein the A/D converter is configured by any of a successive approximation type A/D converter, a flash type A/D converter, a pipeline type A/D converter, and a $\Sigma\Delta$ type A/D converter.

10. The semiconductor integrated circuit according to claim 9,
wherein the semiconductor integrated circuit further comprises an analog multiplexer that can output a signal on one analog input terminal arbitrarily selected from a plurality of analog input terminals to its output terminal in the semiconductor chip, and
wherein an analog selected output signal which has been output from the output terminal of the analog multiplexer can be supplied to an input terminal of the sample and hold circuit.

11. An operation method of a semiconductor integrated circuit comprising an A/D converter that includes a sample and hold circuit and an A/D conversion circuit and a central processing unit in a semiconductor chip,
wherein analog input signals can be supplied from the sample and hold circuit during a holding period to an input terminal of the A/D conversion circuit, and digital output signals resulting from A/D conversion can be generated from an output terminal of the A/D conversion circuit, and
wherein the central processing unit can perform data processing of the digital output signals,
the semiconductor integrated circuit further comprising:
a clock generating unit and a sample and hold signal generating circuit in the semiconductor chip,
wherein the clock generating unit generates an operation clock signal which is supplied to the central processing unit and a clock output signal which is supplied to the sample and hold signal generating circuit, wherein, in a calibration operation of the semiconductor integrated circuit, in response to the clock output signal, the sample and hold signal generating circuit generates a plurality of clock signals whose timings differ from one another and supplies the clock signals sequentially to a sample and hold control input terminal of the sample and hold circuit, wherein, in the calibration operation, the A/D conversion circuit converts a plurality of analog signals held at each timing of each of the clock signals by the sample and hold circuit sequentially to a plurality of digital signals, wherein, in the calibration operation, by executing analysis of the digital signals, a timing of a holding period of the sample and hold circuit for allowing A/D conversion of the A/D converter under a low noise condition is selected from the clock signals, and wherein, in a normal operation of the semiconductor integrated circuit, a clock signal having the timing of the holding period, selected out of the clock signals by the calibration operation, is supplied to the sample and hold circuit as a sample and hold control signal and analog signals held at the timing of the sample and hold control signal by the sample and hold circuit are A/D converted by the A/D conversion circuit and output as the digital output signals.

12. The operation method of the semiconductor integrated circuit according to claim 11, wherein the sample and hold signal generating circuit comprises a variable delay circuit, a control unit that controls the variable delay circuit, and a control register for the control unit, wherein the variable delay circuit comprises a plurality of delay circuits that generate a plurality of clock signals whose timings differ from one another in response to the clock output signal and a plurality of switches, the clock signals being supplied to one ends of the switches and the other ends of the switches being coupled in common to the sample and hold control input terminal of the sample and hold circuit, wherein, in the calibration operation, the clock signals are supplied, as the sample and hold control signal, sequentially to the sample and hold control input terminal of the sample and hold circuit by controlling the switches in the variable delay circuit to be in a conducting state in sequence under control of the control unit, wherein selection data for selecting the timing of the holding period for allowing the A/D conversion under a low noise condition from the clock signals by executing the analysis of the digital signals in the calibration operation is stored in the control register of the sample and hold signal generating circuit, and wherein, in the normal operation, in response to the selection data stored in the control register of the sample and hold signal generating circuit, the control unit controls one switch selected among the switches in the variable delay circuit to be in a conducting state and, by the one switch, the clock signal is selected as the sample and hold control signal and supplied to the sample and hold circuit.

13. The operation method of the semiconductor integrated circuit according to claim 12, wherein the clock generating unit is configured by a phase locked loop circuit comprising a voltage controlled oscillator that generates the operation clock signal and a frequency divider that generates the clock output signal by dividing the frequency of the operation clock signal.

14. The operation method of the semiconductor integrated circuit according to claim 12, wherein the analysis of the digital signals in the calibration operation is executed by the central processing unit or a digital signal processor formed in the semiconductor chip.

15. The operation method of the semiconductor integrated circuit according to claim 14, wherein the semiconductor integrated circuit further comprises a memory for storing a program for the analysis of the digital signals in the calibration operation to be executed by the central processing unit or the digital signal processor in the semiconductor chip.

16. The operation method of the semiconductor integrated circuit according to claim 15, wherein the memory for storing the program is a nonvolatile memory.

17. The operation method of the semiconductor integrated circuit according to claim 12, wherein the calibration operation is executed in an initialization sequence upon power-on of the semiconductor integrated circuit.

18. The operation method of the semiconductor integrated circuit according to claim 17, wherein, during normal operation of the semiconductor integrated circuit, the calibration operation is executed, each time a predetermined operating time period has elapsed after the start of the normal operation.

19. The operation method of the semiconductor integrated circuit according to claim 12, wherein the A/D converter is configured by any of a successive approximation type A/D converter, a flash type A/D converter, a pipeline type A/D converter, and a $\Sigma\Delta$ type A/D converter.

20. The operation method of the semiconductor integrated circuit according to claim 19, wherein the semiconductor integrated circuit further comprises an analog multiplexer that can output a signal on one analog input terminal arbitrarily selected from a plurality of analog input terminals to its output terminal in the semiconductor chip, and wherein an analog selected output signal which has been output from the output terminal of the analog multiplexer can be supplied to an input terminal of the sample and hold circuit.

* * * * *